US011255608B2

(12) United States Patent
Valenti et al.

(10) Patent No.: US 11,255,608 B2
(45) Date of Patent: *Feb. 22, 2022

(54) HEAT EXCHANGER ASSEMBLIES FOR ELECTRONIC DEVICES

(71) Applicant: Qorvo US, Inc., Greensboro, NC (US)

(72) Inventors: Gregory Valenti, Livermore, CA (US); Dylan Murdock, Bend, OR (US); Eric Jackson, Moorpark, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/288,735

(22) Filed: Feb. 28, 2019

(65) Prior Publication Data

US 2020/0041209 A1 Feb. 6, 2020

Related U.S. Application Data

(60) Provisional application No. 62/714,852, filed on Aug. 6, 2018.

(51) Int. Cl.
*F28D 1/04* (2006.01)
*H01P 1/26* (2006.01)
*H05K 7/20* (2006.01)

(52) U.S. Cl.
CPC ............ *F28D 1/0443* (2013.01); *H01P 1/262* (2013.01); *H05K 7/209* (2013.01); *H05K 7/20927* (2013.01)

(58) Field of Classification Search
CPC ....... F28D 1/0443; H01P 1/262; H05K 7/209; H05K 7/20927

(Continued)

(56) References Cited

U.S. PATENT DOCUMENTS 3,023,382 A 2/1962 Borghetti
4,234,854 A 11/1980 Schellenberg et al.
(Continued)

FOREIGN PATENT DOCUMENTS

EP 2469996 A2 6/2012
EP 3279597 A1 2/2018
(Continued)

OTHER PUBLICATIONS

Non-Final Office Action for U.S. Appl. No. 16/005,794, dated Oct. 7, 2019, 11 pages.
(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

Heat exchanger assemblies for electronic devices are disclosed. A heat exchanger assembly may include a heat transfer body that has a face that forms open passageways. A cover structure may be attached to the heat transfer body in a manner to enclose the open passageways, thereby forming a heat exchanger assembly that includes enclosed fluid conduits. In this regard, the enclosed fluid conduits may form complex and intricate patterns within the heat exchanger assembly that are tailored to the heat requirements of a particular application. Heat exchanger assemblies as described herein may be thermally coupled to a center waveguide section of a spatial power-combining device. The enclosed fluid conduits may be tailored based on locations of amplifiers within the center waveguide section to provide improved thermal operation of the spatial power-combining device.

20 Claims, 7 Drawing Sheets

(58) Field of Classification Search
USPC .......................................................... 333/136
See application file for complete search history.

(56) References Cited

U.S. PATENT DOCUMENTS

| | | | |
|---|---|---|---|
| 4,424,496 | A | 1/1984 | Nichols et al. |
| 4,612,512 | A | 9/1986 | Powell et al. |
| 4,724,400 | A | 2/1988 | Luettgenau |
| 5,036,335 | A | 7/1991 | Jairam |
| 5,162,803 | A | 11/1992 | Chen |
| 5,214,394 | A | 5/1993 | Wong |
| 5,256,988 | A | 10/1993 | Izadian |
| 5,736,908 | A | 4/1998 | Alexanian et al. |
| 5,920,240 | A | 7/1999 | Alexanian et al. |
| 6,028,483 | A | 2/2000 | Shealy et al. |
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 * | 5/2007 | Jia ............................ H01P 5/12 333/125 |
| 7,466,203 | B2 | 12/2008 | Rector |
| 8,698,577 | B2 | 4/2014 | Sherrer et al. |
| 8,801,922 | B2 | 8/2014 | Wrazel et al. |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,293,801 | B2 | 3/2016 | Courtney et al. |
| 9,325,074 | B2 | 4/2016 | Chandler |
| 9,547,344 | B2 | 1/2017 | Han |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1 | 12/2018 | Kitt |
| 2004/0108903 | A1 | 6/2004 | Channabasappa et al. |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2010/0065256 | A1 | 3/2010 | Wilcoxon et al. |
| 2011/0300230 | A1 | 12/2011 | Peterson et al. |
| 2013/0003309 | A1 | 1/2013 | Stella |
| 2014/0145794 | A1 | 5/2014 | Courtney et al. |
| 2014/0145795 | A1 | 5/2014 | Behan et al. |
| 2014/0167880 | A1 | 6/2014 | Daughenbaugh, Jr. |
| 2015/0270817 | A1 | 9/2015 | Campbell |
| 2017/0149113 | A1 | 5/2017 | Theveneau et al. |
| 2017/0179598 | A1 | 6/2017 | Kitt |
| 2018/0187984 | A1 | 7/2018 | Manzo |
| 2018/0294539 | A1 | 10/2018 | Kitt |
| 2019/0007007 | A1 | 1/2019 | Kitt |
| 2019/0067778 | A1 | 2/2019 | Mohan |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |
| 2019/0068141 | A1 | 2/2019 | Yoon et al. |
| 2019/0081453 | A1 | 3/2019 | Meehan et al. |
| 2019/0140356 | A1 | 5/2019 | Mohan |

FOREIGN PATENT DOCUMENTS

| | | | |
|---|---|---|---|
| EP | 3454370 A1 | 3/2019 | |
| WO | WO-2017214357 A2 * | 12/2017 | ................ F28F 1/36 |
| WO | 2018143495 A1 | 7/2018 | |

OTHER PUBLICATIONS

Notice of Allowance for U.S. Appl. No. 16/042,351, dated Nov. 18, 2019, 7 pages.

Non-Final Office Action for U.S. Appl. No. 16/008,586, dated Oct. 24, 2019, 10 pages.

Non-Final Office Action for U.S. Appl. No. 161191,541, dated Dec. 9, 2019, 7 pages.

Corrected Notice of Allowance and Examiner-Initiated Interview Summary for U.S. Appl. No. 15/846,840, dated Dec. 12, 2019, 6 pages.

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Bathe TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

(56) References Cited

OTHER PUBLICATIONS

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Notice of Allowance for U.S. Appl. No. 16/005,794, dated Jan. 9, 2020, 7 pages.
Non-Final Office Action for U.S. Appl. No. 16/032,252, dated Dec. 27, 2019, 5 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 15/981,516, dated Jan. 15, 2020, 7 pages.
Non-Final Office Action for U.S. Appl. No. 15/933,821, dated Jul. 11, 2019, 7 pages.
Non-Final Office Action for U.S. Appl. No. 15/981,516, dated Jul. 17, 2019, 5 pages.
Notice of Allowance for U.S. Appl. No. 16/191,541, dated Jul. 9, 2020, 7 pages.
Non-Final Office Action for U.S. Appl. No. 16/284,214, dated Aug. 20, 2020, 5 pages.
Corrected Notice of Allowability and Examiner-Initiated Interview Summary for U.S. Appl. No. 16/005,794, dated May 26, 2020, 6 pages.
Notice of Allowance for U.S. Appl. No. 16/032,252, dated Jun. 1, 2020, 7 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Final Office Action for U.S. Appl. No. 16/191,541, dated Mar. 31, 2020, 8 pages.
Advisory Action, Examiner-Initiated Interview Summary, and AFCP 2.0 Decision for U.S. Appl. No. 16/191,541, dated May 21, 2020, 5 pages.
Non-Final Office Action for U.S. Appl. No. 16/288,761, dated Apr. 1, 2021, 8 pages.
Examiner-Initiated Interview Summary for U.S. Appl. No. 16/288,761, dated Jun. 18, 2021, 2 pages.
Notice of Allowance for U.S. Appl. No. 16/288,761, dated Jun. 29, 2021, 7 pages.
Non-Final Office Action for U.S Appl. No. 16/928,092, dated Oct. 27, 2021, 5 pages.
Non-Final Office Action for U.S. Appl. No. 16/820,880, dated Nov. 19, 2021, 10 pages.
Non-Final Office Action for U.S. Appl. No. 16/821,531, dated Nov. 10, 2021, 15 pages.

\* cited by examiner

HEAT EXCHANGER ASSEMBLIES FOR ELECTRONIC DEVICES

PRIORITY APPLICATION

This application claims the benefit of provisional patent application Ser. No. 62/714,852, filed Aug. 6, 2018, the disclosure of which is hereby incorporated herein by reference in its entirety.

RELATED APPLICATION

The present application is related to U.S. patent application Ser. No. 16/288,761 filed on Feb. 28, 2019, now U.S. Patent Application Publication No. 2020/0041210 A1, entitled "HEAT EXCHANGER ASSEMBLIES FOR ELECTRONIC DEVICES AND RELATED METHODS," which is incorporated herein by reference in its entirety.

FIELD OF THE DISCLOSURE

The disclosure relates generally to heat exchanger assemblies for electronic devices and, more particularly, to heat exchanger assemblies for spatial power-combining devices.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures are related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges. Additional size and structural considerations for spatial power-combining devices involve providing good thermal management for heat generated during amplification.

The art continues to seek improved spatial power-combining devices having improved thermal management and good operating performance while being capable of overcoming challenges associated with conventional devices.

SUMMARY

Aspects disclosed herein relate to heat exchanger assemblies for electronic devices and, more particularly, to heat exchanger assemblies for spatial power-combining devices. According to embodiments disclosed herein, a heat exchanger assembly includes a heat transfer body that has a face that forms open passageways. A cover structure may be attached to the heat transfer body in a manner to enclose the open passageways, thereby forming a heat exchanger assembly that includes enclosed fluid conduits. In this regard, the enclosed fluid conduits may form complex and intricate patterns within the heat exchanger assembly that are tailored to the heat requirements of a particular application. In certain embodiments, heat exchanger assemblies as described herein are thermally coupled to a center waveguide section of a spatial power-combining device. The enclosed fluid conduits may be tailored based on locations of amplifiers within the center waveguide section to provide improved thermal operation of the spatial power-combining device.

In one aspect, a heat exchanger assembly for an electronic device comprises: a heat transfer body comprising a first face and a second face that opposes the first face, wherein the first face forms a plurality of open passageways; and a cover structure attached to the first face, wherein the cover structure and the plurality of open passageways of the heat transfer body form a plurality of enclosed fluid conduits. In certain embodiments, the cover structure is attached to areas of the first face of the heat transfer body that are between individual passageways of the plurality of open passageways. The cover structure may comprise a plurality of ports that are configured to provide fluid to the plurality of enclosed fluid conduits. In certain embodiments, the plurality of enclosed fluid conduits are arranged in different concentrations within different areas of the heat exchanger assembly. At least one enclosed fluid conduit of the plurality of enclosed fluid conduits may be arranged with a different diameter than other enclosed fluid conduits of the plurality of enclosed fluid conduits. At least one enclosed fluid conduit of the plurality of enclosed fluid conduits may comprise alternating concave and convex curved portions. At least one enclosed fluid conduit of the plurality of enclosed fluid conduits may be configured to split into multiple enclosed fluid conduits between a first edge and a second edge of the heat transfer body. At least one enclosed fluid conduit of the plurality of enclosed fluid conduits may transverse the heat exchanger assembly in a linear manner between two radially arranged fluid conduits of the plurality of enclosed fluid conduits. In certain embodiments, the heat transfer body forms a cylindrical shape with a hollow center opening and the second face of the heat transfer body is oriented toward the hollow center opening.

In another aspect, a spatial power-combining device for modifying a signal comprises: a center waveguide section configured between an input coaxial waveguide section and an output coaxial waveguide section; and a heat exchanger assembly thermally coupled to the center waveguide section, the heat exchanger assembly comprising a heat transfer body and a cover structure attached to heat transfer body, wherein the heat transfer body and the cover structure form a plurality of enclosed fluid conduits. The center waveguide section may form a cylindrical shape. In certain embodiments, the heat exchanger assembly forms a corresponding cylindrical shape with a hollow center opening and the center waveguide section is arranged inside the hollow center opening of the heat exchanger assembly and thermally coupled to an inner face of the heat transfer body. The center waveguide section may comprise a plurality of amplifier assemblies radially arranged about a center axis. In certain embodiments, a body structure of each amplifier assembly of the plurality of amplifier assemblies comprises a same material as the heat transfer body. Each amplifier assembly of the plurality of amplifier assemblies may comprise an amplifier. In certain embodiments, the plurality of enclosed fluid conduits are arranged in different concentrations within different areas of the heat exchanger assembly and areas of the heat exchanger assembly that are registered with each amplifier comprise increased concentrations of enclosed fluid conduits. In certain embodiments, areas of the heat exchanger assembly that are registered with each amplifier comprise enclosed fluid conduits of the plurality of enclosed fluid conduits with diameters that are smaller than diameters of other enclosed fluid conduits of the plurality of enclosed fluid conduits. The spatial power-combining device may further comprise: an input coaxial waveguide section configured to concurrently provide a signal to an input antenna structure of each amplifier assembly of the plurality of amplifier assemblies; and an output coaxial waveguide section configured to concurrently combine a signal from an output antenna structure of each amplifier assembly of the plurality of amplifier assemblies. The spatial power-combining may further comprise an input port configured to propagate a signal to the input coaxial waveguide section and an output port configured to receive an amplified signal from the output coaxial waveguide section. In certain embodiments, at least one enclosed fluid conduit of the plurality of enclosed fluid conduits comprises alternating concave and convex curved portions.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
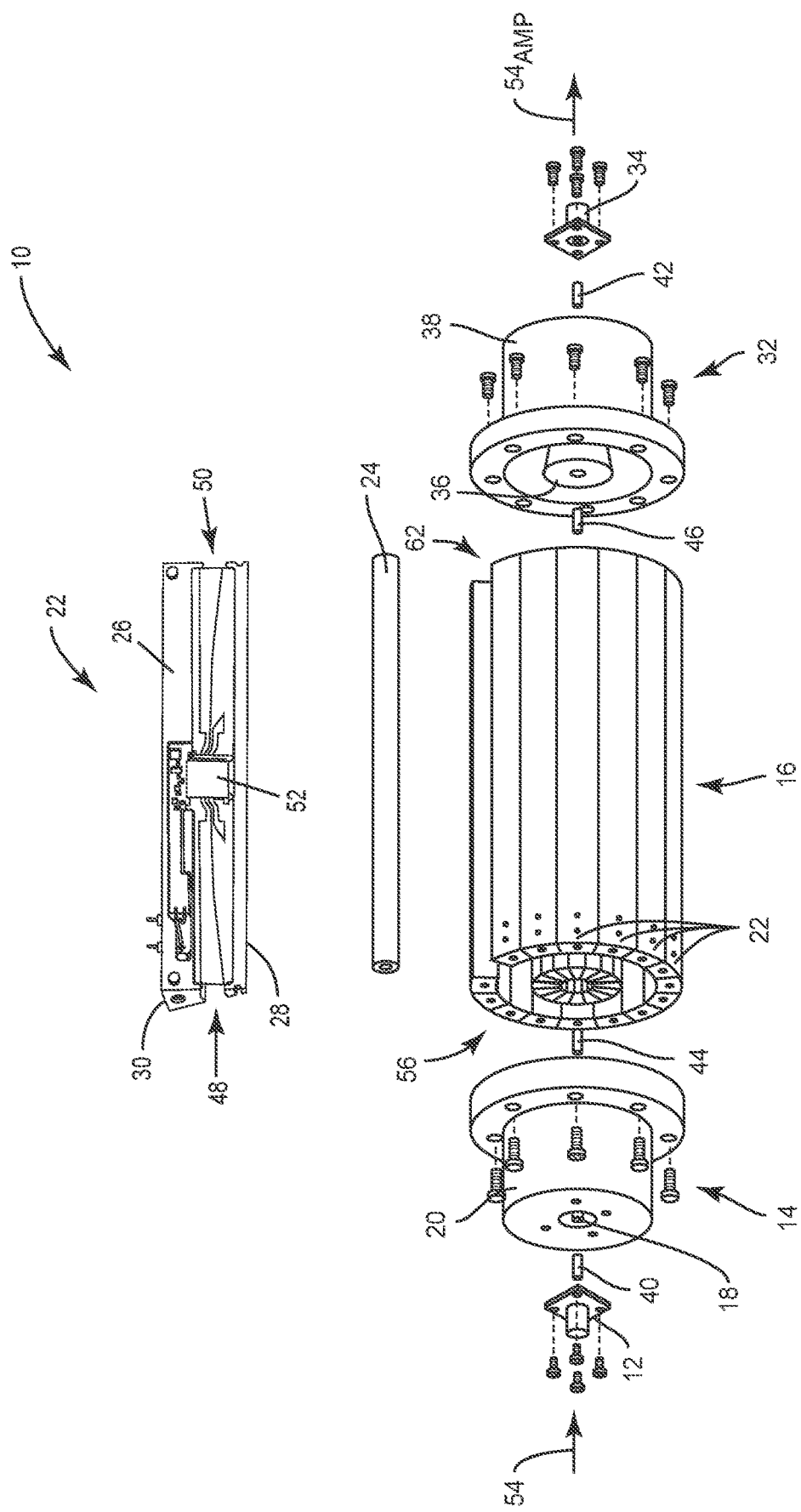
FIG. 1 is a partially-exploded perspective view of a spatial power-combining device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to heat exchanger assemblies for electronic devices and, more particularly, to heat exchanger assemblies for spatial power-combining devices. According to embodiments disclosed herein, a heat exchanger assembly includes a heat transfer body that has a face that forms open passageways. A cover structure may be attached to the heat transfer body in a manner to enclose the open passageways, thereby forming a heat exchanger assembly that includes enclosed fluid conduits. In this regard, the enclosed fluid conduits may form complex and intricate patterns within the heat exchanger assembly that are tailored to the heat requirements of a particular application. In certain embodiments, heat exchanger assemblies as described herein are thermally coupled to a center waveguide section of a spatial power-combining device. The enclosed fluid conduits may be tailored based on locations of amplifiers within the center waveguide section to provide reduced operating temperature of the spatial power-combining device.

The embodiments are particularly adapted to spatial power-combining devices that operate at microwave frequencies such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. A spatial power-combining device may operate within one or more common radar bands including, but not limited to S-band, C-band, X-band, Ku-band, K-band, Ka-band, and Q-band. In some embodiments, by way of non-limiting examples, the operating frequency range includes an operating bandwidth spread of 2 GHz to 20 GHz.

A spatial power-combining device generally includes a plurality of amplifier assemblies, and each amplifier assembly is an individual signal path and includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies are typically arranged coaxially about a center axis. Accordingly, the spatial power-combining device is configured to split, amplify, and combine an electromagnetic signal.

FIG. 1 is a partially-exploded perspective view of a spatial power-combining device 10. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 includes an inner conductor 18 and an outer conductor 20 that radially surrounds the inner conductor 18, thereby forming an opening therebetween. Outer surfaces of the inner conductor 18 and an inner surface of the outer conductor 20 have gradually changed profiles configured to minimize the impedance mismatch from the input port 12 to the center waveguide section 16.

The center waveguide section 16 comprises a plurality of amplifier assemblies 22 arranged radially around a center axis of the spatial power-combining device 10. In certain embodiments, a center post 24 is provided at the center axis for mechanical support and the plurality of amplifier assemblies 22 may be positioned circumferentially around the center post 24. In other embodiments, the center post 24 may be omitted. In FIG. 1, the center post 24 is illustrated in an exploded manner. Each amplifier assembly 22 comprises a body structure 26 having a predetermined wedge-shaped cross-section, an inner surface 28, and an arcuate outer surface 30. When the amplifier assemblies 22 are collectively assembled radially about the center axis, they form the center waveguide section 16 with a generally cylindrical shape; however, other shapes are possible, such as rectangular, oval, or other geometric shapes.

The spatial power-combining device 10 also comprises an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 GHz, the output port 34 may comprise a waveguide output port, such as a WR28 or other sized waveguide. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 includes an inner conductor 36 and an outer conductor 38 that radially surrounds the inner conductor 36, thereby forming an opening therebetween. Outer surfaces of the inner conductor 36 and an inner surface of the outer conductor 38 have gradually changed profiles configured to minimize the impedance mismatch from the output port 34 to the center waveguide section 16. In certain embodiments, a pin 40 connects between the input port 12 and the input coaxial waveguide section 14, and a pin 42 connects between the output port 34 and the output coaxial waveguide section 32. In certain embodiments, the center post 24 connects with the inner conductors 18, 36 by way of screws 44, 46 on opposite ends of the center post 24. The center post 24 is provided for simplifying mechanical connections, may have other than a cylindrical shape, or may be omitted altogether.

Each amplifier assembly 22 comprises an input antenna structure 48 and an output antenna structure 50, both of which are coupled to an amplifier 52. In some embodiments, the amplifier 52 comprises a monolithic microwave integrated circuit (MMIC) amplifier. A MMIC may be a solid-state gallium nitride (GaN) based MMIC. A GaN MMIC device provides high power density and bandwidth, and a spatial power-combining device may combine power from a plurality of GaN MMICs efficiently in a single step to minimize combining loss.

In operation, an input signal 54 is propagated from the input port 12 to the input coaxial waveguide section 14, where it radiates between the inner conductor 18 and the outer conductor 20 and concurrently provides the input signal 54 to the center waveguide section 16. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion to the amplifier 52. The amplifier 52 amplifies the signal portion of the input signal 54 to generate an amplified signal portion that is then transmitted from the amplifier 52 to the output antenna structure 50. The plurality of output antenna structures 50 forms an output antenna array 62 that operates to provide the amplified signal portions to be concurrently combined inside the opening of the output coaxial waveguide section 32 to form an amplified output signal $54_{AMP}$, which is then propagated through the output coaxial waveguide section 32 to the output port 34.

The spatial power-combining device 10 is typically utilized for high power-combining applications. Accordingly, the amplifier 52 in each of the amplifier assemblies 22 is configured for high power amplification, and may therefore generate a high amount of heat. If the operating temperature of each amplifier 52 increases too much, the performance and lifetime of each amplifier 52 may suffer. As previously described, the plurality of amplifier assemblies 22 form the center waveguide section 16. In this regard, thermal management is needed to effectively dissipate heat in and around the center waveguide section 16. Accordingly, the body structure 26 of each amplifier assembly 22 may typically comprise a highly thermally conductive material, such as copper (Cu), aluminum (Al), or alloys thereof that are configured to dissipate enough heat from the amplifier 52 to maintain a suitably low operating temperature. In addition to highly thermally conductive metals, the body structure 26 may comprise highly thermally conductive polymers and ceramics, including graphite or graphene, or other highly thermally conductive materials.

Figure 2:
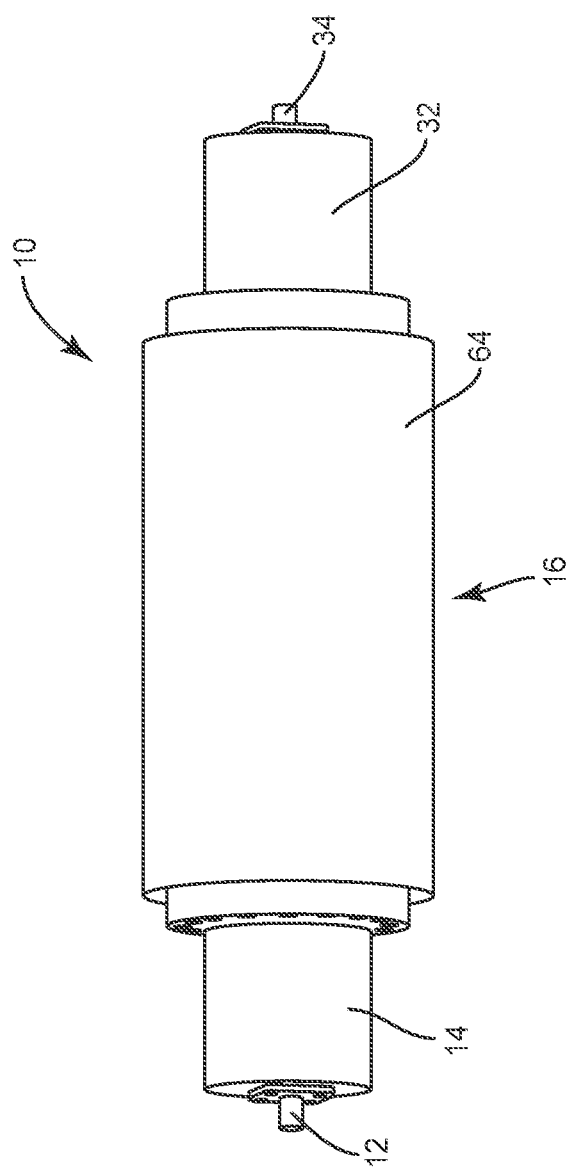
FIG. 2 is a perspective view of the assembled spatial power-combining device of FIG. 1 with a heat exchanger assembly according to embodiments disclosed herein.

FIG. 2 is a perspective view of the assembled spatial power-combining device 10 of FIG. 1 with a heat exchanger assembly 64 according to embodiments disclosed herein. In certain embodiments, the heat exchanger assembly 64 is thermally coupled to the center waveguide section 16, which is obscured from view by the heat exchanger assembly 64 in FIG. 2. In particular, the heat exchanger assembly 64 may be thermally coupled to the arcuate outer surface (30 of FIG. 1) of each amplifier assembly (22 of FIG. 1) to further dissipate or transfer heat away from each amplifier (52 of FIG. 1). As illustrated in FIG. 2, the heat exchanger assembly 64 is registered with the center waveguide section 16. In this manner, the heat exchanger assembly 64 is arranged between the input port 12 and the output port 34. The heat exchanger assembly 64 is also arranged between the input coaxial waveguide section 14 and the output coaxial waveguide section 32. In certain embodiments, the heat exchanger assembly 64 forms a cylindrical shape that is configured to radially surround the center waveguide section 16, which also forms a cylindrical shape. As shown in FIG. 2, the heat exchanger assembly 64 may radially protrude from the spatial power-combining device 10 when compared to the input coaxial waveguide section 14 and the output coaxial waveguide section 32. In this regard, the heat exchanger assembly 64 may be configured to provide increased surface area for heat dissipation or transfer. In certain embodiments, the heat exchanger assembly 64 comprises a highly thermally conductive material, such as Cu, Al, or alloys thereof. In addition to highly thermally conductive metals, the heat exchanger assembly 64 may comprise thermally conductive polymers or ceramics, including graphite or graphene, or other highly thermally conductive materials. In certain embodiments, the heat exchanger assembly 64 may comprise the same material as the body structure (26 of FIG. 1) of each amplifier assembly (22 of FIG. 1). In other embodiments, the heat exchanger assembly 64 comprises a different material than the body structure (26 of FIG. 1).

Accordingly to embodiments disclosed herein, heat exchanger assemblies may include a heat transfer body and a cover structure that is attached to the heat transfer body. A first face of the heat transfer body may form a plurality of open passageways. When the cover structure is attached to the first face of the heat transfer body, the cover structure is configured to enclose the open passageways to form a plurality of enclosed fluid conduits within a heat exchanger assembly. Forming the plurality of open passageways on the first face of the heat transfer body before enclosing the passageways allows improved thermal structures for the plurality of enclosed fluid conduits. For example, the plurality of enclosed fluid conduits may be formed with different diameters, depths, different paths, and localized areas with increased or decreased concentrations or densities within the heat exchanger assembly that would not otherwise be possible if fluid conduits are formed within a solid material. This allows the plurality of enclosed fluid conduits to be tailored to particular applications. For example, in spatial power-combining devices, heat exchanger assemblies may be configured with enclosed fluid conduits that are tailored to provide increased localized cooling in the areas closest to the amplifiers.

Figure 3:
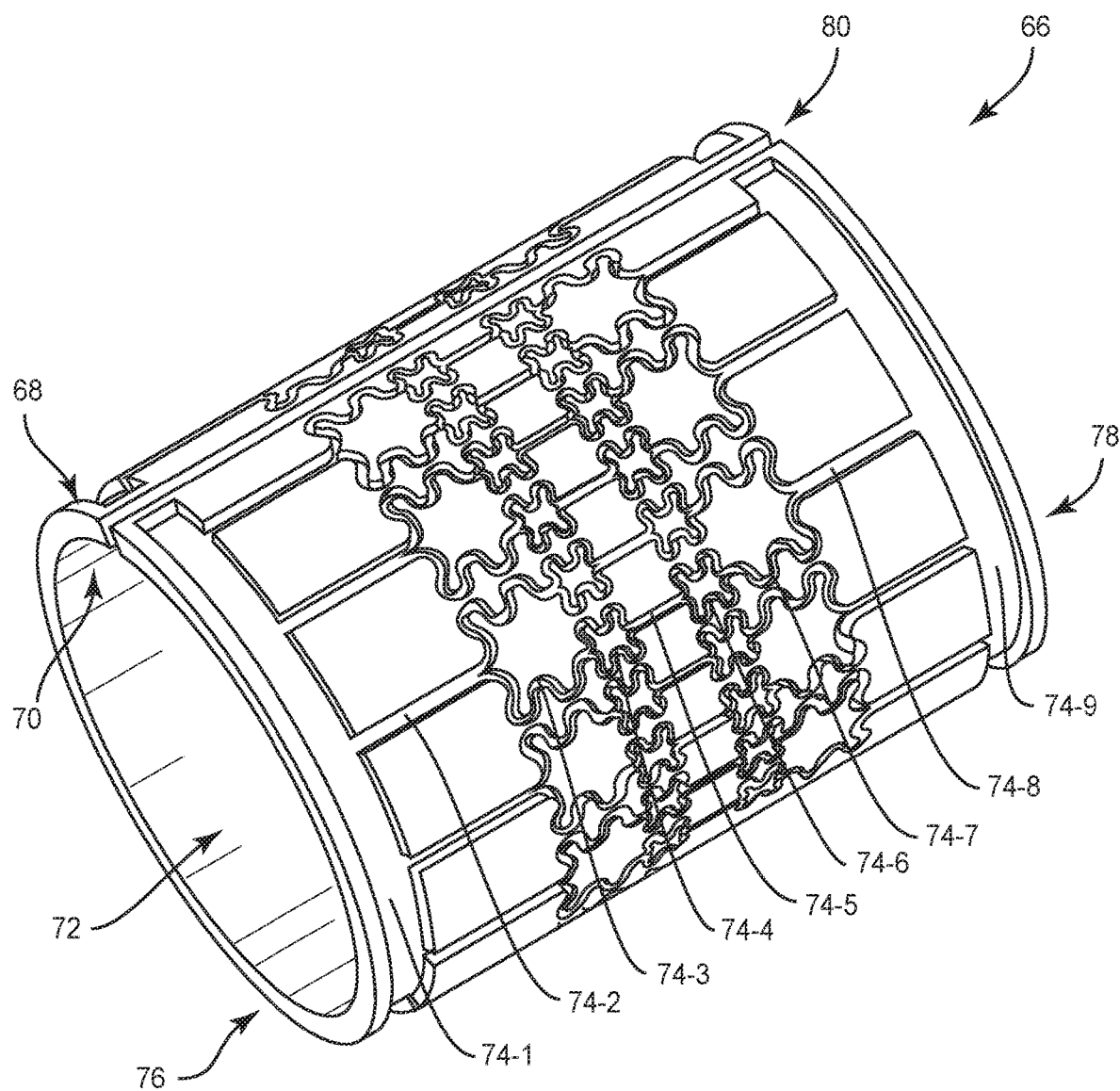
FIG. 3 is a perspective view of a heat transfer body according to embodiments disclosed herein.

FIG. 3 is a perspective view of a heat transfer body 66 according to embodiments disclosed herein. The heat transfer body 66 is illustrated with a cylindrical shape in FIG. 3 that corresponds to the cylindrical shape of the center waveguide section (16 of FIG. 1). In other embodiments, the heat transfer body 66 may have other shapes that correspond to other shapes of electronic devices. The heat transfer body 66 includes a first face 68 and a second face 70 that opposes the first face 68. For the first face 68 to oppose the second face 70, at least one additional surface, side, or face of the heat transfer body 66 is arranged between the first face 68 and the second face 70. As illustrated in FIG. 3, for a cylindrically shaped heat transfer body 66, the first face 68 corresponds to an outer face of the heat transfer body 66 and the second face 70 corresponds to an inner face of the heat transfer body 66 that is oriented toward a hollow center opening 72. In this regard, when fully assembled in the spatial combining device 10 of FIG. 1, the center waveguide section (16 of FIG. 1) is arranged inside the hollow center opening 72 and thermally coupled with the heat transfer body 66 by way of the second face 70. In certain embodiments, the heat transfer body 66 comprises a highly thermally conductive material, including various highly thermally conductive metals, polymers, or ceramics as previously described. The heat transfer body 66 may comprise additional features configured to further improve heat dissipation or heat transfer. As illustrated in FIG. 3, the first face 68 includes a plurality of open passageways 74-1 to 74-9, which may also be referred to as channels or trenches in the first face 68. In certain embodiments, the plurality of open passageways 74-1 to 74-9 are subsequently enclosed by later described structures to form fluid conduits for cooling. In certain embodiments, the open passageways 74-1 to 74-9 are configured differently in different areas of the first face 68. For example, the passageway 74-1 is arranged radially on the first face 68 and adjacent to a first edge 76 of the heat transfer body 66. Multiple passageways 74-2 extend from the passageway 74-1 in a longitudinal direction away from the first edge 76. Each of the passageways 74-2 split into multiple passageways 74-3, which in turn split into multiple passageways 74-4. Pairs of the passageways 74-4 combine into the passageways 74-5 that are centrally located on the first face 68. The passageways 74-6 to 74-8 may follow the same progression but in reverse toward the passageway 74-9 that is radially arranged on the first face 68 and adjacent to a second edge 78 of the heat transfer body 66. In this manner, the passageways 74-3 to 74-7 are arranged with increased densities or concentrations near a central portion of the first face 68 that is between the first edge 76 and the second edge 78 of the heat transfer body 66.

In FIG. 3, the heat transfer body 66 forms a gap 80 that transverses from the first edge 76 to the second edge 78. In certain embodiments, the heat transfer body 66 is provided in a planar configuration that is subsequently formed into a final three-dimensional shape, such as the cylindrical shape illustrated in FIG. 3, and the gap 80 is thereby formed. In other embodiments, the gap 80 may not be present. For example, the heat transfer body 66 may initially be provided as a hollow tube and the plurality of open passageways 74-1 to 74-9 are formed on an outer surface of the hollow tube. By forming the plurality of open passageways 74-1 to 74-9 on the first face 68 of the heat transfer body 66 before enclosing the open passageways 74-1 to 74-9, improved thermal structures may be provided that are tailored for specific applications. In certain embodiments, the open passageways 74-1 to 74-9 may be formed on the first face 68 of the heat transfer body 66 by an etching process. For example, the heat transfer body 66 may comprise Cu or Cu alloys in certain embodiments and a chemical etchant for Cu or Cu alloys, such as etchants containing cupric or copper chloride, ferric chloride, or alkaline etchants, among many others, may be used to form the open passageways 74-1 to 74-9 on the first face 68. Specifically, the chemical etchant may by exposed to the first face 68 through a mask with patterned openings that correspond to the open passageways 74-1 to 74-9. In this manner, the open passageways 74-1 to 74-9 may comprise virtually any pattern or arrangement on the first face 68 based on the mask. This allows complex and intricate patterns or arrangements of the open passageways 74-1 to 74-9 to be tailored to the heat requirements of a particular application. Specifically, the open passageways 74-1 to 74-9 may be formed with variations across the first face 68 that correspond to localized areas of the heat transfer body 66 that experience different levels of heat during operation. In this manner, the open passageways 74-1 to 74-9 may be more concentrated in certain areas of the heat transfer body 66, or certain passageways 74-1 to 74-9 may be configured with different depths or widths in localized areas of the heat transfer body 66. Chemical etching provides the ability to mass produce heat transfer bodies as described above with reduced costs and repeatability, regardless of the complexity of the patterns of the open passageways 74-1 to 74-9. In other embodiments, the open passageways 74-1 to 74-9 may be formed by other techniques, including laser machining, rotary table machining, micromachining, multi-axis machining, water jet cutting, sandblasting, glass bead blasting, three-dimensional printing, molding, and injection molding depending on the material of the heat transfer body 66.

Figure 4:
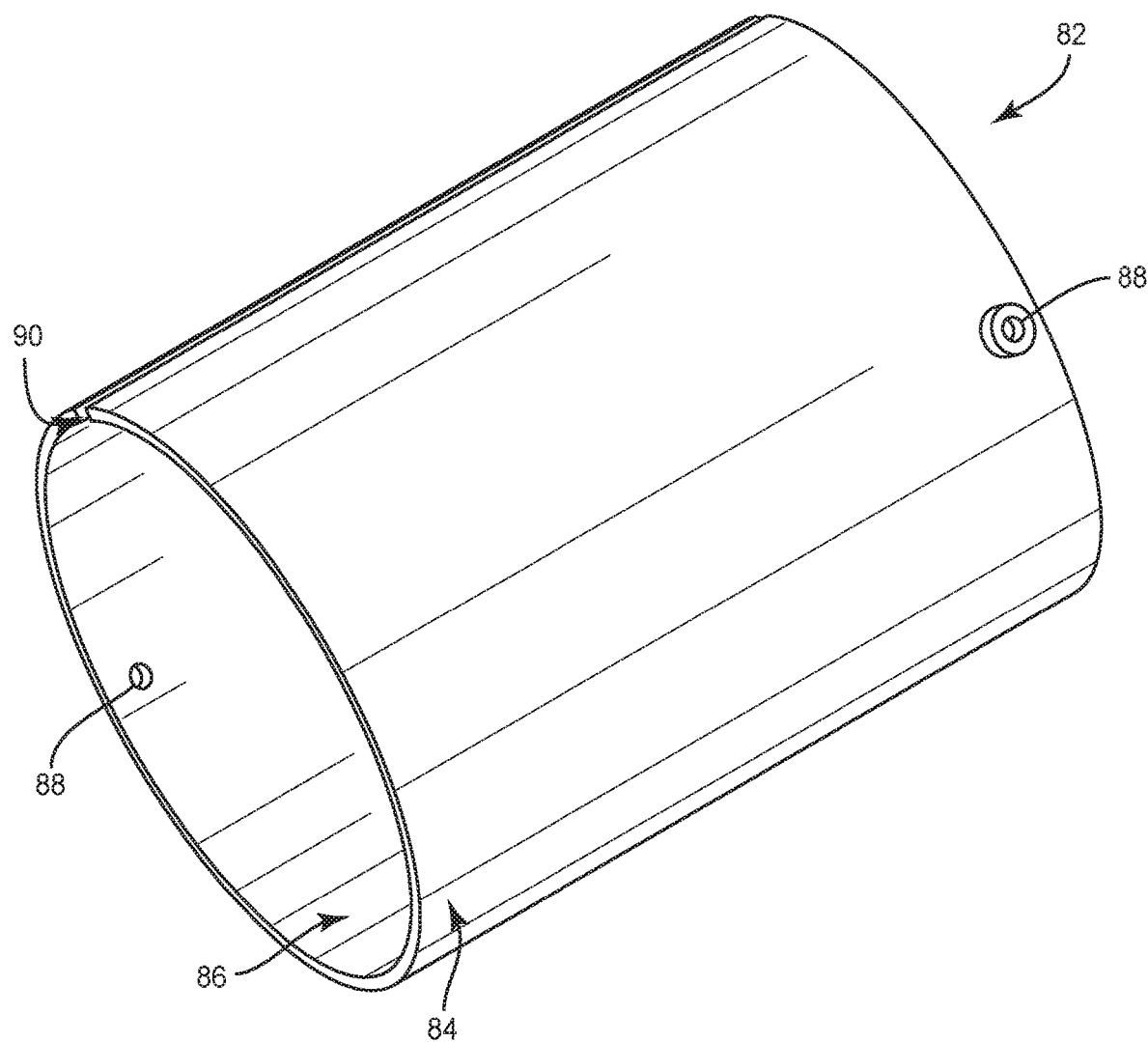
FIG. 4 is a perspective view of a cover structure that is configured to cover the heat transfer body of FIG. 3 according to embodiments disclosed herein.

FIG. 4 is a perspective view of a cover structure 82 that is configured to cover the heat transfer body 66 of FIG. 3 according to embodiments disclosed herein. In certain embodiments, the cover structure 82 comprises a shape that is configured in a similar manner to the first face (68 of FIG. 3) of the heat transfer body (66 of FIG. 3). In this regard, the cover structure 82 is illustrated with a cylindrical shape having an outer face 84 and an inner face 86, and the heat transfer body (66 of FIG. 3) may be thermally coupled to the cover structure 82 by way of the inner face 86. The cover structure 82 may additionally include a plurality of ports 88 that are configured to allow fluid flow through the cover structure 82. In certain embodiments, the cover structure 82 comprises a hightly thermally conductive material, such as Cu, Al, or alloys thereof. In addition to highly thermally conductive metals, the cover structure 82 may comprise thermally conductive polymers or ceramics, including graphite or graphene, or other highly thermally conductive materials. In certain embodiments, the cover structure 82 may comprise the same material as the heat transfer body (66 of FIG. 3). In other embodiments, the cover structure 82 may comprise a different material than the heat transfer body (66 of FIG. 3). For example, the cover structure 82 may comprise a material with lower thermal conductivity in embodiments where the heat transfer body (66 of FIG. 3) provides sufficient reduced operating temperatures. In certain embodiments, the cover structure 82 is provided in a planar configuration that is subsequently formed into a final three-dimensional shape, such as the cylindrical shape illustrated in FIG. 4. In three-dimensional form, the cover structure 82 may form a gap 90. In other embodiments, the gap 90 may not be present.

Figure 5A:
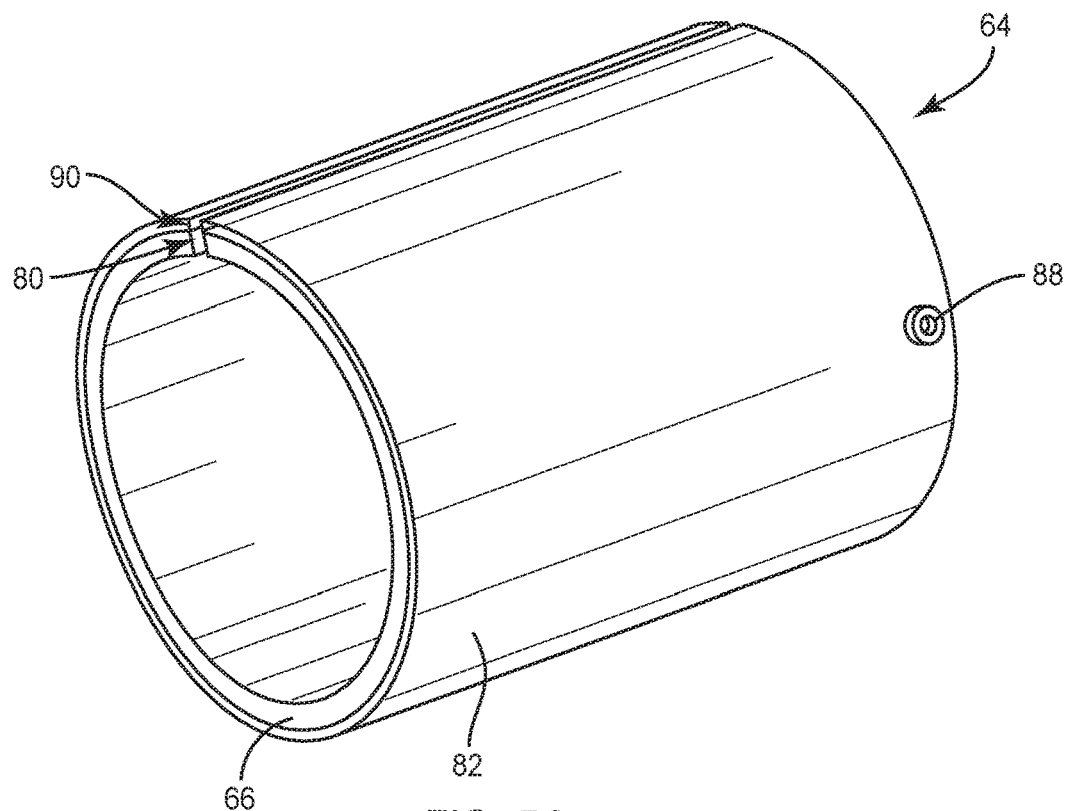
FIG. 5A is a perspective view of an assembled heat exchanger assembly that includes the heat transfer body of FIG. 3 and the cover structure of FIG. 4.
Figure 5B:
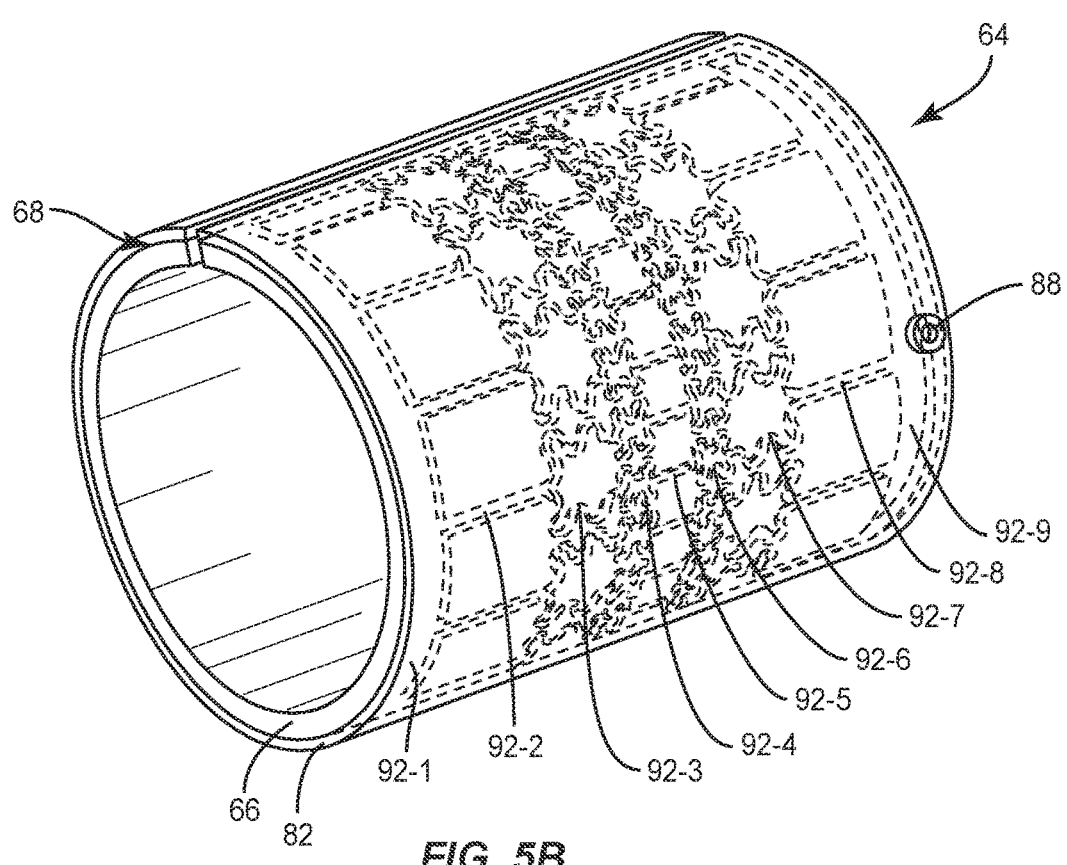
FIG. 5B is a perspective view of the heat exchanger assembly of FIG. 5A with the cover structure shown as transparent for illustrative purposes.

FIG. 5A is a perspective view of an assembled heat exchanger assembly 64 that includes the heat transfer body 66 of FIG. 3 and the cover structure 82 of FIG. 4. As illustrated, the cover structure 82 is attached to cover or enclose the first face (68 of FIG. 3) of the heat transfer body 66. In certain embodiments, the cover structure 82 may be soldered, brazed, welded, bonded with epoxy, or otherwise bonded to the heat transfer body 66. In other embodiments, the cover structure 82 may be mechanically attached by screws or the like to the heat transfer body 66. When present, the gap 80 of the heat transfer body 66 may be configured in alignment with the gap 90 of the cover structure 82. The plurality of ports 88 in the cover structure 82 as previously described may be provided to allow fluid flow into and out of the heat exchanger assembly 64. FIG. 5B is a perspective view of the heat exchanger assembly 64 of FIG. 5A with the cover structure 82 shown as transparent for illustrative purposes. When the cover structure 82 is attached to the first face 68 of the heat transfer body 66, the plurality of open passageways (74-1 to 74-9 of FIG. 3) are enclosed to form a plurality of enclosed fluid conduits 92-1 to 92-9. In particular, the cover structure 82 may be configured to attach, contact, or bond with areas of the first face 68 that are between individual open passageways of the plurality of open passageways (74-1 to 74-9 of FIG. 3), thereby enclosing and sealing the plurality of open passageways (74-1 to 74-9 of FIG. 3) to form the enclosed fluid conduits 92-1 to 92-9. Fluid, such as a cooling liquid or a cooling gas, may be provided into and out of the heat exchanger assembly 64 by way of the plurality of ports 88. In certain embodiments, a certain port 88 is registered with at least one fluid conduit 92-9 and another port, which is obscured from view in the illustration of FIG. 5B, may be registered with a different fluid conduit 92-1. In this manner, fluid may be provided to flow into the heat exchanger assembly 64 and transverse the heat exchanger assembly 64 within the enclosed fluid conduits 92-1 to 92-9, before exiting the heat exchanger, thereby providing improved heat dissipation or heat transfer. In certain embodiments, the cover structure 82 may be attached to the heat transfer body 66 with one or more gaskets or o-rings that are configured to seal the enclosed fluid conduits 92-1 to 92-9.

In certain embodiments, the enclosed fluid conduits 92-1 to 92-9 are arranged with variations across the first face 68 that correspond to localized areas of the heat exchanger assembly 64 that experience different levels of heat during operation as previously described. In this manner, the enclosed fluid conduits 92-1 to 92-9 may be more concentrated in certain areas of the heat exchanger assembly 64, or certain fluid conduits 92-1 to 92-9 may be configured with different dimensions such as different diameters in localized areas of the heat exchanger assembly 64. For a spatial power-combining device, the fluid conduits 92-1 to 92-9 may be more concentrated in areas of the heat exchanger assembly 64 that correspond to the location of the amplifiers. As illustrated in FIG. 1, the amplifiers (52 of FIG. 1) may be centrally located within the center waveguide section (16 of FIG. 1). Accordingly, the fluid conduits 92-1 to 92-9 may be more concentrated in central portions of the heat exchanger assembly 64 than in portions that are closer to peripheral edges of the heat exchanger assembly 64. Localized areas of the heat exchanger assembly 64 with higher concentrations of the fluid conduits 92-1 to 92-9 allow an increased amount of fluid in the localized areas, thereby increasing cooling capabilities. In certain embodiments, certain fluid conduits 92-3 to 92-7 may have smaller diameters than other fluid conduits 92-1, 92-2, 92-8, and 92-9. Smaller diameters may promote increased velocity and/or turbulent fluid flow for fluid traversing in certain areas of the heat exchanger assembly 64, thereby providing improved heat transfer and reduced operating temperatures in such areas. In this manner, localized areas of the heat exchanger assembly 64 that experience the highest operating temperatures may be configured to have the highest velocities of fluid flow. In other embodiments, the enclosed fluid conduits 92-1 to 92-9 may be configured with larger diameters in areas that experience the highest operating temperatures. In this regard, an increased quantity of fluid may be provided in the hottest areas of the heat exchanger assembly 64. As illustrated in FIG. 5B, the certain fluid conduits 92-3, 92-4, 92-6, 92-7 may include one or more curved portions. For example, the fluid conduit 92-3 comprises alternating concave and convex curved portions between the fluid conduit 92-2 and the fluid conduit 92-4. In this regard, fluid may flow across an increased area of the heat exchanger assembly 64 between the fluid conduit 92-2 and the fluid conduit 92-4. In a similar manner, the fluid conduit 92-4 comprises alternating concave and convex curved portions between the fluid conduit 92-3 and the fluid conduit 92-5; however, the curved portions of the fluid conduit 92-4 have smaller dimensions than the curved portions of the fluid conduit 92-3. Accordingly, the pattern of the fluid conduit 92-4 may be repeated radially around certain portions of the heat exchanger assembly 64 with closer spacing than the pattern of the fluid conduit 92-3, thereby providing increased fluid flow in such portions of the heat exchanger assembly 64. The plurality of enclosed fluid conduits 92-1 to 92-9 may comprise other features that provide localized areas with increased heat transfer. For example, certain fluid conduits may include increased surface roughness on surfaces inside the fluid conduits. In other examples, certain fluid conduits may comprise protruding features within the fluid conduits, such as micro fin structures or other shapes. In still other examples, certain fluid conduits may comprise transitions in shape, such as a fluid conduit that transitions from a round cross-section into a square-shaped cross section. In certain embodiments, the heat exchanger assembly 64 may be held in place to the center waveguide section (16 of FIG. 1) by a clamp or other mechanical fastener.

Figure 6:
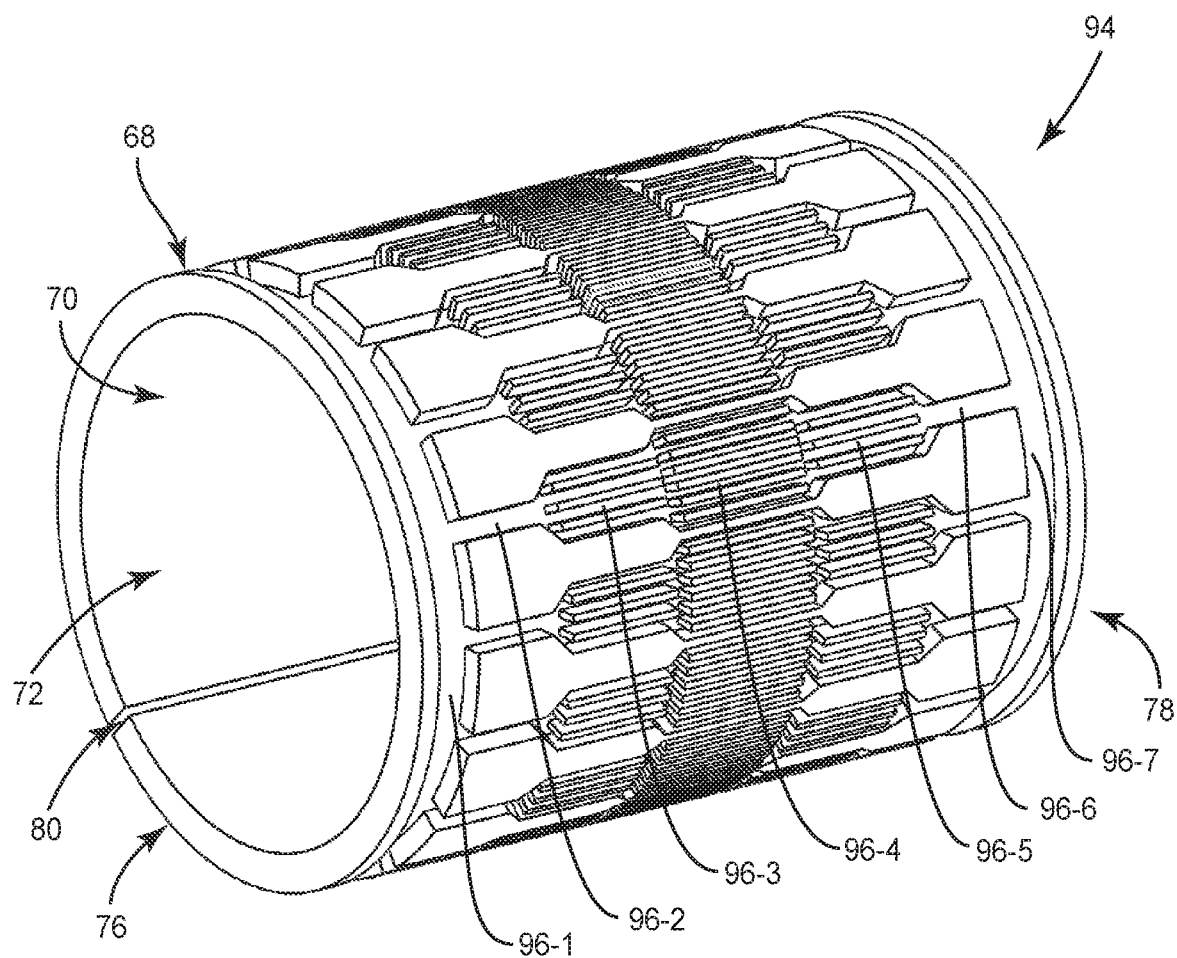
FIG. 6 is a perspective view of a heat transfer body with a different configuration of open passageways according to embodiments disclosed herein.

FIG. 6 is a perspective view of a heat transfer body 94 with a different configuration of a plurality of open passageways 96-1 to 96-7 according to embodiments disclosed herein. The heat transfer body 94 includes the first face 68, the second face 70, the center opening 72, and the gap 80 as previously described. In FIG. 6, the plurality of open passageways 96-1 to 96-7 are configured to divide and subdivide multiple times from the first edge 76 and the second edge 78 of the heat transfer body 94 to a central portion of the heat transfer body 94. For example, the passageway 96-1 is arranged radially on the first face 68 and adjacent to the first edge 76 of the heat transfer body 94. Multiple passageways 96-2 extend from the passageway 96-1 in a longitudinal direction away from the first edge 76. Each passage way 96-2 is then configured to split into multiple passageways 96-3, and in turn, split into even more passageways 96-4 that are centrally located between the first edge 76 and the second edge 78. The pattern repeats itself in reverse from the passageways 96-4 to the passageway 96-7 that is adjacent to the second edge 78. In this manner, the passageways 96-4 are configured to radially cover the highest area of the heat transfer body 94. When enclosed as previously described, the passageways 96-1 to 96-7 thereby provide fluid conduits that have a highest concentration along a central radial area of the heat transfer body 94. In other embodiments, other areas of the heat transfer body 94 may be configured with the highest concentration of the passageways 96-1 to 96-7 corresponding to different portions of the heat transfer body 94 that may experience higher operating temperatures. As illustrated in FIG. 6, the passageways 96-1 to 96-7 are configured to divide in a linear manner.

Figure 7:
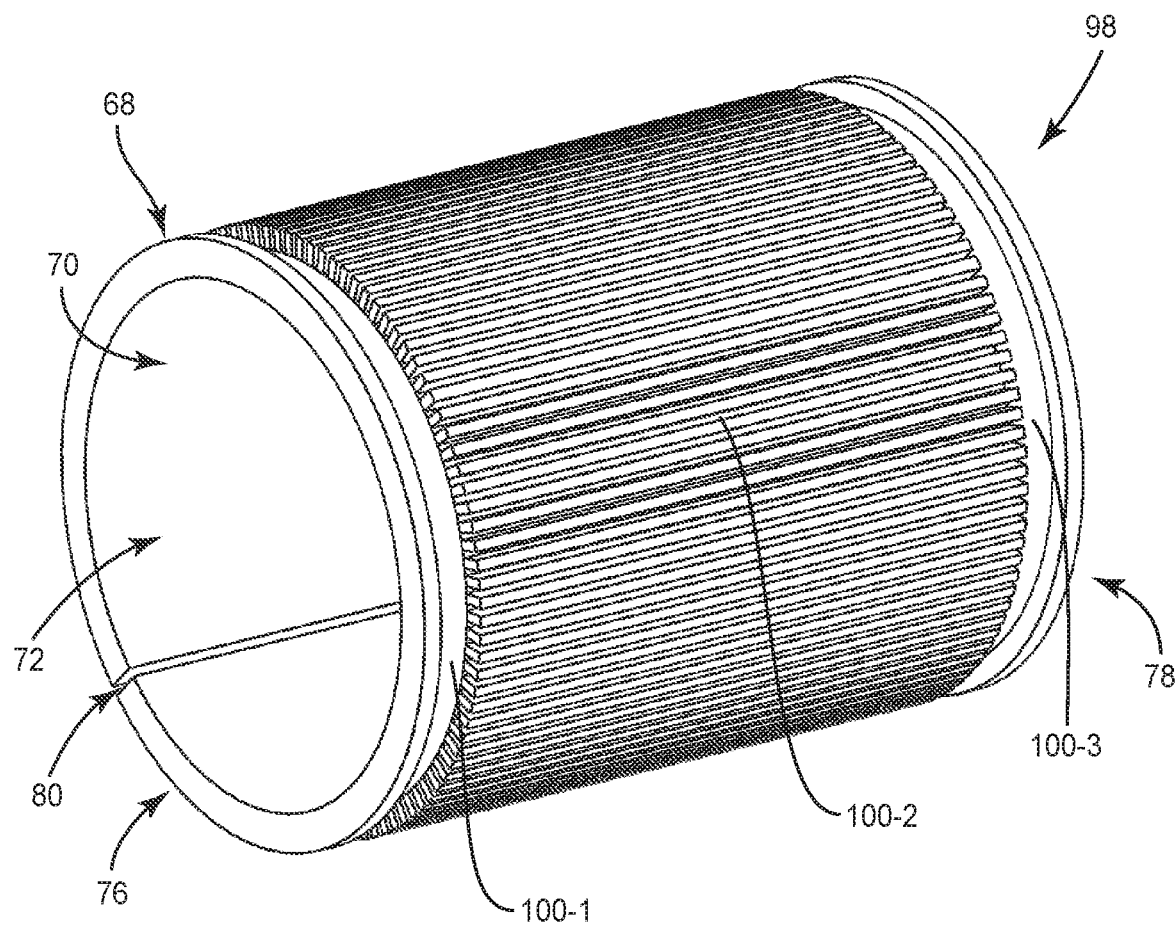
FIG. 7 is a perspective view of a heat transfer body with a different configuration of open passageways according to embodiments disclosed herein.

FIG. 7 is a perspective view of a heat transfer body 98 with a different configuration of a plurality of open passageways 100-1 to 100-3 according to embodiments disclosed herein. The heat transfer body 98 includes the first face 68, the second face 70, the center opening 72, and the gap 80 as previously described. In FIG. 7, the passageway 100-1 is arranged radially on the first face 68 and adjacent to the first edge 76 of the heat transfer body 98. Multiple passageways 100-2 extend from the passageway 100-1 in a linear and longitudinal manner to the passageway 100-3 that is radially arranged adjacent to the second edge 78 of the heat transfer body 98. When enclosed as previously described, the passageways 100-1 to 100-3 thereby provide a plurality of linear fluid conduits that transverse the heat transfer body 98 in a linear manner between two radially arranged fluid conduits that are arranged adjacent to the first and second edges 76, 78 of the of the heat transfer body 98.

Those skilled in the art will recognize improvements and modifications to the preferred embodiments of the present disclosure. All such improvements and modifications are considered within the scope of the concepts disclosed herein and the claims that follow.

What is claimed is:

1. A heat exchanger assembly for an electronic device, comprising:
   a heat transfer body comprising a first face and a second face that opposes the first face, wherein the first face forms a plurality of open passageways within the first face; and
   a cover structure attached to areas of the first face that are between individual passageways of the plurality of open passageways, wherein the cover structure and the plurality of open passageways of the heat transfer body form a plurality of enclosed fluid conduits.

2. The heat exchanger assembly of claim 1, wherein the cover structure comprises a plurality of ports that are configured to provide fluid to the plurality of enclosed fluid conduits.

3. The heat exchanger assembly of claim 1, wherein the plurality of enclosed fluid conduits are arranged in different concentrations within different areas of the heat exchanger assembly.

4. The heat exchanger assembly of claim 1, wherein at least one enclosed fluid conduit of the plurality of enclosed fluid conduits is arranged with a different diameter than other enclosed fluid conduits of the plurality of enclosed fluid conduits.

5. The heat exchanger assembly of claim 1, wherein at least one enclosed fluid conduit of the plurality of enclosed fluid conduits comprises alternating concave and convex curved portions.

6. The heat exchanger assembly of claim 1, wherein at least one enclosed fluid conduit of the plurality of enclosed fluid conduits is configured to split into multiple enclosed fluid conduits between a first edge and a second edge of the heat transfer body.

7. The heat exchanger assembly of claim 1, wherein at least one enclosed fluid conduit of the plurality of enclosed fluid conduits transverses the heat exchanger assembly in a linear manner between two radially arranged fluid conduits of the plurality of enclosed fluid conduits.

8. The heat exchanger assembly of claim 1, wherein the heat transfer body forms a cylindrical shape with a hollow center opening and the second face of the heat transfer body is oriented toward the hollow center opening.

9. A spatial power-combining device for modifying a signal comprising:
   a center waveguide section configured between an input coaxial waveguide section and an output coaxial waveguide section; and
   a heat exchanger assembly thermally coupled to the center waveguide section, the heat exchanger assembly comprising a heat transfer body and a cover structure attached to the heat transfer body, wherein the heat transfer body and the cover structure form a plurality of enclosed fluid conduits;
   wherein the center waveguide section forms a cylindrical shape and the heat exchanger assembly forms a corresponding cylindrical shape with a hollow center opening, and wherein the center waveguide section is arranged inside the hollow center opening of the heat exchanger assembly and the center waveguide section is thermally coupled to an inner face of the heat transfer body.

10. The spatial power-combining device of claim 9, wherein the center waveguide section comprises a plurality of amplifier assemblies radially arranged about a center axis.

11. The spatial power-combining device of claim 10, wherein a body structure of each amplifier assembly of the plurality of amplifier assemblies comprises a same material as the heat transfer body.

12. The spatial power-combining device of claim 10, wherein each amplifier assembly of the plurality of amplifier assemblies comprises an amplifier.

13. The spatial power-combining device of claim 12, wherein the plurality of enclosed fluid conduits are arranged in different concentrations within different areas of the heat exchanger assembly and areas of the heat exchanger assembly that are registered with each amplifier comprise increased concentrations of enclosed fluid conduits.

14. The spatial power-combining device of claim 12, wherein areas of the heat exchanger assembly that are registered with each amplifier comprise enclosed fluid conduits of the plurality of enclosed fluid conduits with diameters that are smaller than diameters of other enclosed fluid conduits of the plurality of enclosed fluid conduits.

15. The spatial power-combining device of claim 10, further comprising:
   an input coaxial waveguide section configured to concurrently provide a signal to an input antenna structure of each amplifier assembly of the plurality of amplifier assemblies; and
   an output coaxial waveguide section configured to concurrently combine a signal from an output antenna structure of each amplifier assembly of the plurality of amplifier assemblies.

16. The spatial power-combining device of claim 15, further comprising an input port configured to propagate a signal to the input coaxial waveguide section and an output port configured to receive an amplified signal from the output coaxial waveguide section.

17. The spatial power-combining device of claim 9, wherein at least one enclosed fluid conduit of the plurality of enclosed fluid conduits comprises alternating concave and convex curved portions.

18. A spatial power-combining device for modifying a signal comprising:
   a center waveguide section configured between an input coaxial waveguide section and an output coaxial waveguide section and comprising a plurality of amplifier assemblies radially arranged about a center axis; and
   a heat exchanger assembly thermally coupled to the center waveguide section, the heat exchanger assembly comprising a heat transfer body and a cover structure attached to the heat transfer body, wherein the heat transfer body and the cover structure form a plurality of enclosed fluid conduits;
   wherein a body structure of each amplifier assembly of the plurality of amplifier assemblies comprises a same material as the heat transfer body.

19. The spatial power-combining device of claim 18, wherein the plurality of enclosed fluid conduits are arranged in different concentrations within different areas of the heat exchanger assembly.

20. The spatial power-combining device of claim 18, wherein at least one enclosed fluid conduit of the plurality of enclosed fluid conduits comprises alternating concave and convex curved portions.

* * * * *